United States Patent [19]

Malchow

[11] 4,272,726
[45] Jun. 9, 1981

[54] DIFFERENTIAL FM DETECTOR WITH SERIES TUNED FILTER

[75] Inventor: Max E. Malchow, Flemington, N.J.

[73] Assignee: RCA Corporation, New York, N.Y.

[21] Appl. No.: 59,469

[22] Filed: Jul. 20, 1979

[51] Int. Cl.³ .............................................. H03D 3/14
[52] U.S. Cl. .................................... 329/103; 329/143; 455/214
[58] Field of Search ............... 329/103, 137, 140, 143; 455/214, 337

[56] References Cited

U.S. PATENT DOCUMENTS

| | | | |
|---|---|---|---|
| 2,341,240 | 2/1944 | Reid | 329/143 |
| 2,404,359 | 7/1946 | Bond | 329/140 |
| 2,497,840 | 2/1950 | Seeley | 329/130 |
| 2,497,841 | 2/1950 | Seeley | 329/129 |
| 2,520,621 | 8/1950 | Beers, Jr. | 329/140 X |
| 3,519,944 | 7/1970 | Avins | 329/103 |
| 3,588,721 | 6/1971 | Keller et al. | 329/137 X |
| 3,628,046 | 12/1971 | Bilotti | 307/241 |

Primary Examiner—Siegfried H. Grimm
Attorney, Agent, or Firm—Eugene M. Whitacre; Eric P. Herrmann; Peter M. Emanuel

[57] ABSTRACT

A balanced discriminator for frequency modulation systems particularly useful in integrated circuit applications. A source of FM signal having substantially zero source impedance drives a discriminator circuit-differential peak detector combination. The discriminator comprises first and second like capacitors connected between the FM source and first and second input connections to the differential peak detector respectively, an inductor connected between the input connections of the differential peak detector, and a third capacitor connected between said second input connection and a point of fixed potential.

15 Claims, 3 Drawing Figures

DIFFERENTIAL FM DETECTOR WITH SERIES TUNED FILTER

This invention relates to frequency modulation systems, and more particularly to frequency modulation (FM) discriminators which are useful for integrated circuit applications.

Typically, discriminator circuits for integrated-circuit (IC) applications are chosen to minimize the number of circuit elements external to the IC, particularly inductive ones. It is generally desired to eliminate inductive elements where possible. To this end J. Avins developed a single-inductor discriminator described in U.S. Pat. No. 3,519,944 entitled, "Angle Modulation Discriminator Detector Circuit", issued July 7, 1970. This discriminator utilizes a circuit having a parallel-tuned circuit serially connected with a capacitor to form an additional series-tuned circuit. The circuit is driven single-ended with a modulated waveform, the carrier frequency of which is arranged between the resonant frequencies of the parallel-and series-tuned elements. Signals from the series-tuned and parallel-tuned circuits are applied to detector apparatus now commonly identified as a "differential peak detector".

Amplitude, AM, changes in the frequency modulated, FM, waveform ideally would be applied to both input terminals of the differential peak detector and cancelled by the common mode rejection of the circuit. However, due to the single-ended or unbalanced drive to the discriminator and the imposition of unequal circuit elements between the discriminator input terminal and the differential peak detector input terminals in the Avins circuit, the amplitude of AM variations applied to the detector input terminals tend to be unequal and therefore only partially cancel. This is particularly bothersome under multipath reception conditions where the carrier amplitude fluctuates as a result of the system receiving signals from multiple transmission paths which tend to cancel.

The single-ended drive to the discriminator coil in the Avins circuit is typically provided via a resistive element, used to supply direct biasing potential to the peak detector. Drive is usually from the resistive collector load of one of a pair of emitter-coupled transistors used as a wideband limiter amplifier. Unfortunately, the output signal of such a limiter amplifier tends to include a spurious component in the same range of frequencies (hereinafter termed "low frequencies") as the signals that angle-modulate the carrier. This spurious component is generated by the limiter amplifier detecting the amplitude modulation (AM) of the carrier wave by noise and is a primary source of the low-frequency signal adversely affecting the AM rejection of the Avins detector at center-tuning.

The present invention is embodied in a balanced discriminator having a single tuned circuit in combination with a differential peak detector. The discriminator produces two frequency-sensitive signals for application to the peak detector. Signal is coupled from the discriminator input connection to the differential input connections of the peak detector by like reactive components so that noise and AM variations are applied equally. This produces superior performance with respect to noise and AM rejection and reduces the effect of the multipath problems. Provision is made for incorporating a tuned circuit to enhance the noise performance of the detector.

Figure 1:
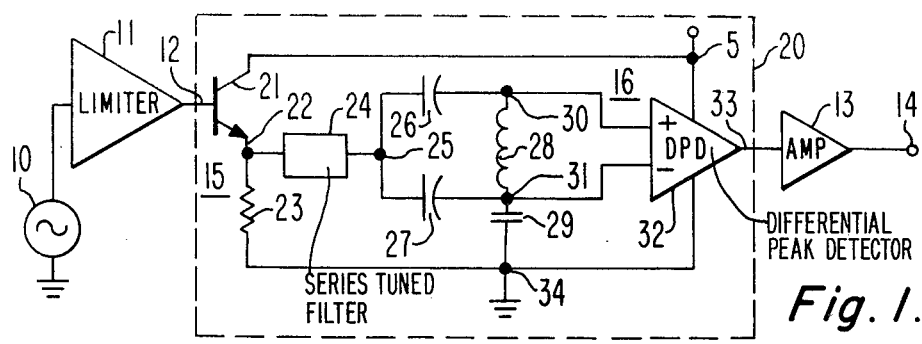
FIGS. 1 and 2 are schematic diagrams of FM discriminators in circuits, each of which embodies the invention.

Referring to the FIG. 1, the embodiment of the invention is circumscribed by the broken line 20. Source 10 is a source of frequency-modulated signals, e.g., an FM tuner. Signals from source 10 are applied to amplifier-limiter 11 which amplifies and limits the signal at prescribed potential levels, conditioning the signal applied to connection 12 to be of constant amplitude.

FM signal at connection 12 is applied to the input connection of emitter-follower amplifier 15 including transistor 21 and emitter impedance 23. Emitter-follower 15 buffers the output signal from 11 to provide low-impedance drive to discriminator 16. This low-impedance drive is necessary in that the input impedance to the discriminator circuit goes through a null at essentially the center frequency of the FM signal.

The output signal at 22 of emitter-follower 15 is applied via impedance 24 to the input connection 25 of the discriminator 16. Impedance 24 may be a direct connection without substantial intervening impedance or it may be a filter network for reducing the noise voltage applied to the discriminator. Where impedance 24 consists of a filter network, its series impedance must be essentially zero at the signal carrier frequencies. An example of such a filter is a serially connected capacitor and inductor, series-tuned to the particular signal frequency.

Discriminator 16 has capacitor 26 connected between its input connection 25 and signal node 30, capacitor 27 connected between input 25 and signal node 31, inductance 28 connected between nodes 30 and 31 and capacitor 29 connected between node 31 and a point of fixed potential. Discriminator 16 provides two signals, derived from the FM signal, having differing phase and amplitude relationship to the input signal near the resonant frequencies of the circuit. Capacitors 26 and 27 anti-resonate with inductor 28 to establish the upper frequency $f_H$ of the discriminator bandwidth, and capacitors 26, 27 and 29 resonate with inductor 28 to establish the lower frequency $f_{LO}$ of the discriminator bandwidth. It can be shown that the lower and upper frequencies $f_{LO}$ and $f_H$ are related to the respective "zeros" of the discriminator located at the frequencies defined by $(\frac{1}{2}\pi)[2/L(C+Co)]^{(\frac{1}{2})}$ and $(\frac{1}{2}\pi)(2/LC)^{\frac{1}{2}}$ respectively.

Figure 3:
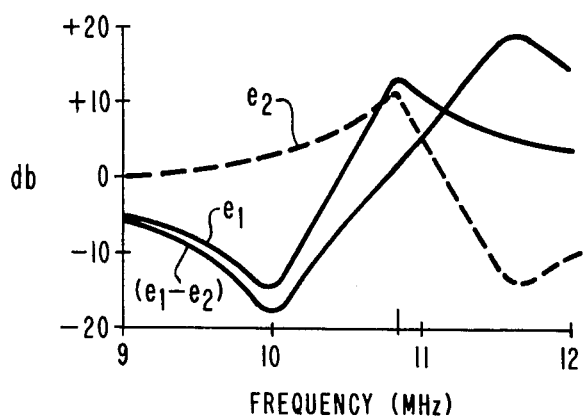
FIG. 3 is a voltage vs. frequency transfer function of the discriminator 16 of FIGS. 1 and 2.

For low-frequency input signals, the impedance of inductor 28 is essentially a short circuit, so the potentials at connections 30 and 31 are the same. As the input signal frequency increases the impedance of 28 increases, causing the potentials at 30 and 31 to diverge. Representative potentials at connections 30 and 31 are plotted as a function of frequency for constant input amplitude signals in FIG. 3. The potentials e1 and e2 appearing at nodes 30 and 31 respectively as a function of the frequency for a constant amplitude signal, e, applied at 25 are given by $$e1 = e\{[2/L(C+Co)] - \omega^2\}/\{[(2C+Co)/LC(C+Co)] - \omega^2\} \quad (1)$$

$$e2 = e\{[C/(C+Co)][(2/LC) - \omega^2]\}/\{[(2C+Co)/LC(C+Co)] - \omega^2\} \quad (2)$$

where ω is angular frequency, C is the capacitance of each of the capacitors 26 and 27; $C_o$ is the capacitance of capacitor 29; L is the inductance of coil 28 and the input impedance to the detector 32 is presumed infinite. The poles and zeros as determined by the reactive elements in equations 1 and 2 in order of increasing frequency are proportioned to $$[2/L(C+C_o)] < [(2C+C_o)/LC(C+C_o)] < (2/LC).$$

The potentials e1 and e2 are substantially equal for frequencies less than the "zero" defined by the numerator of equation 1. Near the "zero" e1 begins to peak in the negative direction then increases in the positive direction peaking at the "pole" defined by the denominator of equation 1. e1 then asymptatically tends toward the value of the input signal potential for large values of input frequency. The potential e2 is substantially constant out to the "pole" common to potential e1 at which point it peaks in the positive direction then decreases until peaking in the negative sense at the "zero" defined by the numerator of equation 2. e2 then increases asymptatically to the value $eC/(C-C_o)$ for large values of ω.

The potentials e1 and e2 are applied to the differential peak detector (DPD) 32, where they are peak detected, i.e., the magnitude of their potential excursions are sensed and differentially amplified producing a demodulated signal at connection 33. The differential peak detector differentially sums the peak voltages at its input connections to provide an output signal potential proportional to (e1−e2). The relationship of the output signal (e1−e2) to the input signals is depicted in the FIG. 3. This signal is then applied to utilization means, a part of which is represented by amplifier 13.

The slope of the (e1−e2) curve is independent of the damping impedance across the inductor. The damping impedance tends to offset the frequency at which potential e1 crosses e2 and thereby determines the linear region of detection, i.e., the bandwidth of the detector. The low frequency tail of the (e1−e2) curve goes to zero but the high frequency tail approaches $e\{1-[C/(C+C_o)]\}$. However, if the series impedance 24 is implemented with a bandpass filter, both the high and low frequency tails of the (e1−e2) curve tend towards zero.

Low frequency noise and undesirable modulation of the FM signal are inhibited by filter 24 and capacitors 26 and 27. The capacitors 26 and 27 being of equal value tend to apply equal values of amplitude modulation signal or AM to the differential inputs of the detector. In general, the signal path for undesirable noise and AM signals through the filter 24 and the discriminator 16 to the input connections of the peak detector are identical, allowing the common mode rejection of the differential peak detector to eliminate such AM signal and noise. The inductor 28 is a d-c short circuit guaranteeing that the bias level of the two input connections of the detector are identical. Capacitors 26 and 27 provide d-c isolation between amplifier 15 and detector 32 so that bias potential may be applied to nodes 30 and 31 independent of the d-c output potential of amplifier 15.

Figure 2:
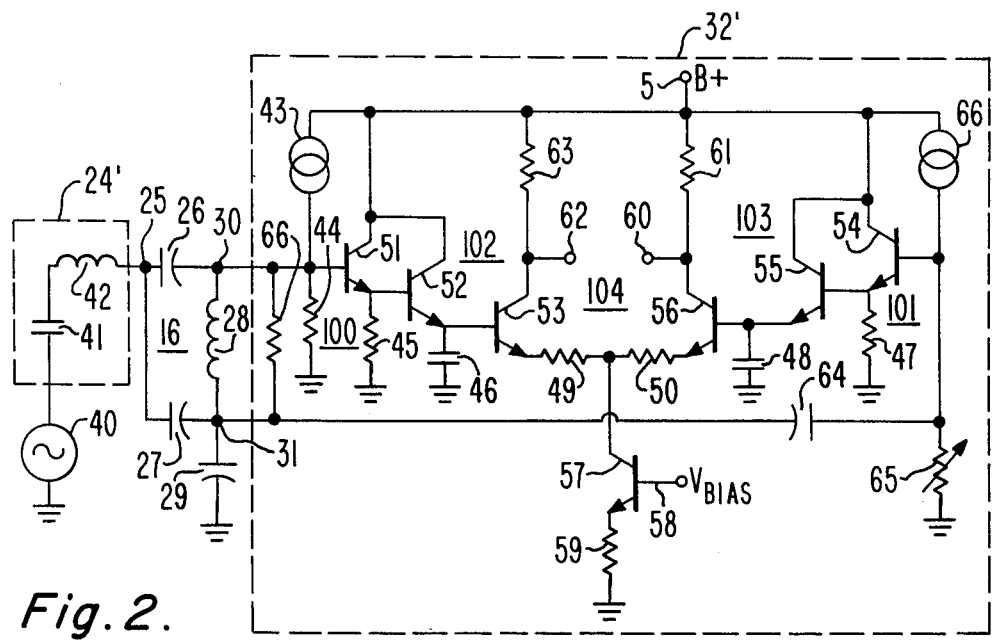

The FIG. 2 circuit illustrates the combination of the balanced or center-tapped discriminator 16 and a specific differential peak detector. Voltage source 40 represents a low-impedance source of amplitude-limited, frequency-modulated signal. Signal from source 40 is applied to discriminator input connection 25 via the filter network 24' including serially connected capacitor 41 and inductor 42. Filter 24' establishes the noise bandwidth of the signal source. Discriminator 16 provides signals e1 and e2 respectively at nodes 30 and 31 to the input connections of detector 32' circumscribed by the broken line. Resistor 66 is superimposed across discriminator terminals 30 and 31 to damp the resonant response of the tuned elements and smooth the effect of the complex conjugate pole.

Nodes 30 and 31 are connected to the input terminals of similar emitter-follower amplifiers 100 and 101 including transistors 51 and 54 and their respective emitter load impedances 45 and 47. Emitter-followers 100 and 101 are included to buffer the signals from nodes 30 and 31, so as not to load the tuned discriminator circuit.

Output signals from amplifiers 100 and 101 are applied to peak detectors 102 and 103 respectively. Peak detector 102 includes transistor 52, capacitor 46 and the impedance of the base circuit of transistor 53. Positive-going signal at the base of transistor 52 causes emitter current from transistor 52 to charge capacitor 46. Negative-going signal tends to reverse-bias the emitter-base junction of 52 turning it off and leaving a potential stored on capacitor 46. Without a current path to discharge capacitor 46 transistor 52 remains off until a positive going signal exceeds the most positive signal occurring previously in time. The bias current to the base of transistor 53 provides a discharge means for capacitor 46. The capacitance value of capacitor 46 is selected relative to the base current of 53 to insure that a prescribed decay in potential will occur across capacitor 46 in one-half period of the input frequency. The potential across 46 will thereby substantially follow the peak value of the potential available from amplifier 100 less the offset potential of the emitter base junction of detector transistor 52. The detector 103 operates in a similar manner.

Detectors 102 and 103 operate independently of each other, operating only on the peaks of signal applied to their input connections. The phase relationship of the two potentials derived from connections 30 and 31 is therefore immaterial.

Detected potentials at capacitors 46 and 48 are applied to differential amplifier 104. Transistors 53 and 56 having their respective emitter electrodes connected via degeneration resistors 49 and 50 for receiving constant current are arranged in typical long-tail-pair configuration with the collector circuit of transistor 57 supplying tail current. Transistors 53 and 56 having respective collector load impedances 63 and 61 develop differential output potentials available at nodes 62 and 60 respectively.

Input bias potential is required at the base electrodes of emitter-follower transistor 51 and 54. The base potential for transistor 51 is developed by resistor 44 serially connected to current source 43. Similarly, base bias potential for transistor 54 is developed by resistor 65 serially connected to current source 66. Resistor 65 is a variable resistance to enable one to balance the circuit. Note that when independent bias means are applied to transistors 51 and 54 a capacitor 64 is required to block the d-c path through the inductance 28. Capacitor 64 is made large enough to pass any noise or AM signal not rejected by filter network 24'.

Alternatively, current source 66 and resistor 65 may be eliminated and capacitor 64 substituted by a short circuit. The d-c potential applied at the base electrode of transistor 51, and passed by the d-c conduction path of inductor 28 will also bias the base electrode of transistor 54.

What is claimed is:

1. In combination with a differential peak detector apparatus with first and second input connections, means for applying FM signals having a center frequency to those input connections, which means comprises:

first reactance means having a first end connection to the first input connection of said differential peak detector apparatus, having a second end connection to the second input connection of said differential peak detector apparatus, and having a center-tap connection;

second reactance means having a first end connection to the first input connection of said differential peak detector apparatus and having a second end connection to the second input connection of said differential peak detector apparatus, for antiresonating said first reactance means at a frequency substantially equal to said center frequency;

third reactance means;

a source of FM signal voltage having substantially no source impedance at said FM signal frequencies compared to the impedances of said first and second and third reactances; and means serially connecting said source of FM signal voltage and said third reactance means between the first end connection and center tap connection of said first reactance means including a series-tuned reactive circuit arranged to pass frequencies within a prescribed range of said center frequency.

2. A combination as set forth in claim 1 wherein the first reactance means comprises first and second capacitors each having respective first and second plates; means interconnecting the first plates of the first and second capacitive means at said center-tap connection; means connecting the respective second plates of the first and second capacitive means to said first and second end connections respectively.

3. A combination as set forth in claim 2 wherein said second reactance means comprises an inductor.

4. A combination as set forth in claim 3 wherein said third reactance means comprises a third capacitance means.

5. A combination as set forth in claim 1 wherein the series tuned reactive circuit comprises:

a blocking capacitor having first and second ends;

a blocking inductor having a first end connected to the first end of the blocking capacitor and having a second end;

means serially connecting the second ends of the blocking capacitor and inductor between the FM source and the center-tap connection.

6. In combination with a differential peak detector apparatus having first and second input connections, which input connections requiring d-c bias potential, means for applying FM signals having a center frequency to said input connections, which means comprises:

a discriminator circuit having an input connection and first and second output connections, including a first capacitor connected between the discriminator input and first output connections, a second capacitor connected between the discriminator input and second output connections, a third capacitor having a first end connected at the discriminator second output terminal and having a second end, and an inductor for antiresonating the first and second capacitor connected between the discriminator first and second output connections;

respective means connecting the first and second discriminator output connections to the first and second differential peak detector input connection;

a source of FM signal voltage having substantially no source impedance at said FM frequencies;

means serially connecting the source of FM signal voltage between the second end of said third capacitor and the discriminator input connection including a series tuned circuit for passing frequencies only within a prescribed range of said center frequency; and means for applying d-c bias potential to the first and second input connections of the differential peak detector circuit.

7. A combination as set forth in claim 6 wherein the means connecting the first and second output connections of the discriminator to the first and second input connections of the differential peak detector are respective d-c connections without substantial intervening impedance; and the means for applying d-c bias to the input connections of the differential peak detector comprises:

a resistor having a first end connected to the first input connection of the differential peak detector and a second end connected to a point of reference potential;

a source of substantially constant current connected for developing a potential across said resistor of such polarity to bias the detector into operation.

8. A combination as set forth in claim 6 wherein the means connecting the first and second output connections of the discriminator circuit respectively to the first and second input connections of the differential peak detector comprise a d-c connection without substantial intervening impedance between the first discriminator output and first detector input connections and a further capacitor connected between the second discriminator output connection and second detector input connection; and the means for providing d-c bias to the input connections of the differential peak detector comprise:

a first resistor connected between the first detector input connection and a point of reference potential;

a first current source serially connected with said first resistor for developing a bias potential across said first resistor;

a second resistor connected between the second detector input connection and the point of reference potential; and a second current source serially connected with said second resistor for developing a bias potential across said second resistor.

9. A combination as set forth in claim 6 further including a damping resistor between the first and second discriminator output connections.

10. A combination as set forth in claim 6 wherein the first and second capacitors each have a capacitance value equal to C, the third capacitor has a capacitance value equal to $C_o$, the inductor has an inductance L and wherein the bandwidth of the discriminator is constrained to be within an upper frequency limit of $\frac{1}{2}\pi\sqrt{2/(LC)}$ and a lower frequency limit of $\frac{1}{2}\pi\sqrt{2/L(C+C_o)}$.

11. An FM detector for receiving angle-modulated carrier waves from the output circuit of a wideband limiter amplifier—said FM detector of a type comprising first and second transistors of the same conductivity type, each having respective base and emitter electrodes with a respective base-emitter junction therebetween and having a respective collector electrode; means for connecting said first and second transistors as a differential-input amplifier with its input connections at their respective base electrodes and with output connections at their respective collector electrodes, which means includes an interconnection between the emitter electrodes of said first and second transistors, means for causing current to flow between that interconnection and a point of reference potential, and respective means for connecting the collector electrodes of said first and second transistors to a point of operating potential; a discriminator coil having first and second ends; first capacitive means connected in parallel with said discriminator coil for forming an anti-resonant circuit therewith at a predetermined frequency; second capacitive means connected from one of the ends of said discriminator coil to said point of reference potential; first and second semiconductor junction means having respective first electrodes to which the first and second ends of said discriminator coil respectively connect and having respective second electrodes respectively connected to the base electrodes of said first and second transistors, respectively; third capacitive means connected between the second electrode of said first semiconductor junction means and said point of reference potential for completing a first peak detector circuit with said first semiconductor junction; and fourth capacitive means connected between the second electrode of said second semiconductor junction means and said point of reference potential for completing a second peak detector circuit with said second semiconductor junction; and means for coupling the output circuit of said limiter amplifier to said first and second peak detector circuits—and said FM detector being improved in that it includes:

means for blocking the flow of frequencies relatively low with respect to that of said angle-modulated carrier waves from the output circuit of said limiter amplifier to said first and second peak detector circuits including a series resonant circuit interposed between the output circuit of said wideband limiter amplifier and said first capacitive means; and means for applying quiescent bias potentials of substantially similar value to the first electrodes of said first and second semiconductor junction means.

12. An improved FM detector circuit as set forth in claim 11 wherein said first capacitive means consists of: first and second capacitors, having respective first plates respectively connected to the first end of said discriminator coil and to its second end, and having respective second plates joined at an interconnection to which signal from the output circuit of said limiter amplifier is applied, whereby said first and second capacitors are included in said means for blocking the flow of relatively low frequencies, together with resistive means connected between the first and second ends of said discriminator coil; and wherein said series-resonant circuit is interposed between the output of said wideband limiter amplifier and the interconnection of the second plates of said first and second capacitors.

13. An improved FM detector as set forth in claim 12 including:

a third capacitor in the connection of the first end of said discriminator coil to the first electrode of said first semiconductor junction means;

first and second resistive elements being included in said resistive means having respective first ends respectively connected to respective ones of the first electrodes of said first and second semiconductor junction means, and having respective second ends joined at an interconnection;

means for referring the potential at this interconnection to that appearing at said point of reference potential;

means for applying first and second bias currents to the first ends of said first and second resistive means, respectively.

14. An improved FM detector as set forth in claim 13 wherein said means for applying first and second bias currents includes means for adjusting the amplitude of one of said first and second bias currents relative to the amplitude of the other of them.

15. In combination:

a differential peak detector network having first and second input connections and an output connection;

a frequency discriminator network including a discriminator coil with first and second ends;

means connecting the first end of said discriminator coil to the first input connection of said differential peak detector network;

means including a d-c blocking capacitor connecting the second end of said discriminator coil to the second input connection of said differential peak detector network; and means for applying first and second d-c bias potentials to the first input connection of said differential peak detector network and to its second input connection, respectively, including means for adjusting one of said first and second d-c bias potentials respective to the other.

* * * * *